(12) United States Patent
Deak et al.

(10) Patent No.: US 10,564,227 B2
(45) Date of Patent: Feb. 18, 2020

(54) INTEGRATED CURRENT SENSOR USING Z-AXIS MAGNETORESISTIVE GRADIOMETER AND LEAD FRAME CURRENT

(71) Applicant: MultiDimension Technology Co., Ltd., Zhangjiagang (CN)

(72) Inventors: James Geza Deak, Zhangjiagang (CN); Zhimin Zhou, Zhangjiagang (CN)

(73) Assignee: MultiDimension Technology Co., Ltd., Zhangjiagang (CN)

( * ) Notice: Subject to any disclaimer, the term of this patent is extended or adjusted under 35 U.S.C. 154(b) by 183 days.

(21) Appl. No.: 15/570,104
(22) PCT Filed: Apr. 21, 2016
(86) PCT No.: PCT/CN2016/079850
§ 371 (c)(1),
(2) Date: Oct. 27, 2017
(87) PCT Pub. No.: WO2016/173447
PCT Pub. Date: Nov. 3, 2016

(65) Prior Publication Data
US 2018/0143269 A1 May 24, 2018

(30) Foreign Application Priority Data
Apr. 27, 2015 (CN) .......................... 2015 1 0201290

(51) Int. Cl.
*G01R 33/09* (2006.01)
*G01R 15/12* (2006.01)
(Continued)

(52) U.S. Cl.
CPC ............. *G01R 33/09* (2013.01); *G01R 15/12* (2013.01); *G01R 33/0052* (2013.01); *G01R 33/075* (2013.01)

(58) Field of Classification Search
CPC ........ G01R 33/09; G01R 15/00; G01R 15/12; G01R 19/00; G01R 33/0052;
(Continued)

(56) References Cited

U.S. PATENT DOCUMENTS

2007/0159159 A1* 7/2007 Okada .................. G01R 15/205
324/117 H
2011/0080165 A1* 4/2011 Saito .................... G01R 15/205
324/252

FOREIGN PATENT DOCUMENTS

CN       101788596 A       7/2010
CN       102313831          1/2012
(Continued)

OTHER PUBLICATIONS

"International Application No. PCT/CN2016/079850, International Search Report and Written Opinion dated Jul. 19, 2016'", (dated Jul. 19, 2016), 12 pgs.

*Primary Examiner* — Melissa J Koval
*Assistant Examiner* — Courtney G McDonnough
(74) *Attorney, Agent, or Firm* — Schwegman Lundberg & Woessner, P.A.

(57) ABSTRACT

An integrated current sensor comprising a Z axis gradiometer and a lead frame primary coil, wherein the Z-axis gradiometer is a magnetoresistive Z-axis gradient sensor, comprising a substrate, with two elongated soft magnetic flux concentrators placed upon the substrate. The soft ferromagnetic flux concentrators are located above or below but displaced from a long-axis centerline equidistant from the magnetoresistive sensor strings, such that the combined magnetoresistive sensing unit detects the magnetic field perpendicular to the long-axis center line, and it is configured as a gradiometer sensor bridge. The lead frame serves as the primary coil, and the Z-axis gradiometer is placed above or below a cross-section of the current carrying portion of the lead frame, such that the current detection direction is parallel to the long-axis centerline. This sensor can detect currents of up to 5 to 50 A, it has low power consumption, small size, and fully integrated.

13 Claims, 8 Drawing Sheets

(51) Int. Cl.
*G01R 33/00* (2006.01)
*G01R 33/07* (2006.01)

(58) Field of Classification Search
CPC ........ G01R 33/075; H01L 2224/48091; H01L 2224/48247; H01L 2224/73265
USPC .................................................... 324/207.21
See application file for complete search history.

(56) References Cited

FOREIGN PATENT DOCUMENTS

| | | |
|---|---|---|
| CN | 103809008 | 5/2014 |
| CN | 103995240 | 8/2014 |
| CN | 104820125 | 8/2015 |
| CN | 204789707 | 11/2015 |
| WO | WO-2009112412 | 9/2009 |
| WO | WO-2016173447 | 11/2016 |

* cited by examiner

Figure 5:
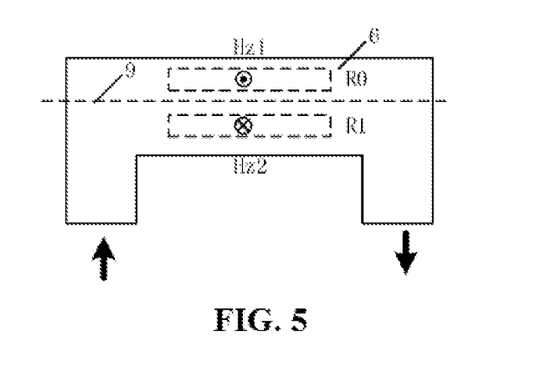
FIG. 5 is a planar structural diagram of a lead frame primary coil integrated current sensor.
Figure 6:
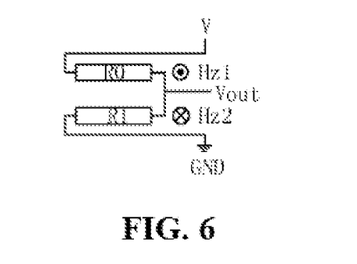
FIG. 6 is a diagram of half-bridge electrical connection of a magnetoresistive gradient sensor of a lead frame primary coil integrated current sensor.

FIG. 16 ated by the current in the primary coil 6 at the position of R0 and the position of R1 are Hz1 and Hz2 respectively, which are of the same magnitude but in opposite directions. A differential connection structure thereof is as shown in FIG. 6, and an intermediate output signal of the half-bridge structure is Vout.

INTEGRATED CURRENT SENSOR USING Z-AXIS MAGNETORESISTIVE GRADIOMETER AND LEAD FRAME CURRENT

TECHNICAL FIELD

The present invention relates to the field of magnetic sensors, and in particular, to an integrated current sensor using a Z-axis magnetoresistive gradiometer and a lead frame current.

BACKGROUND ART

Figure 1:
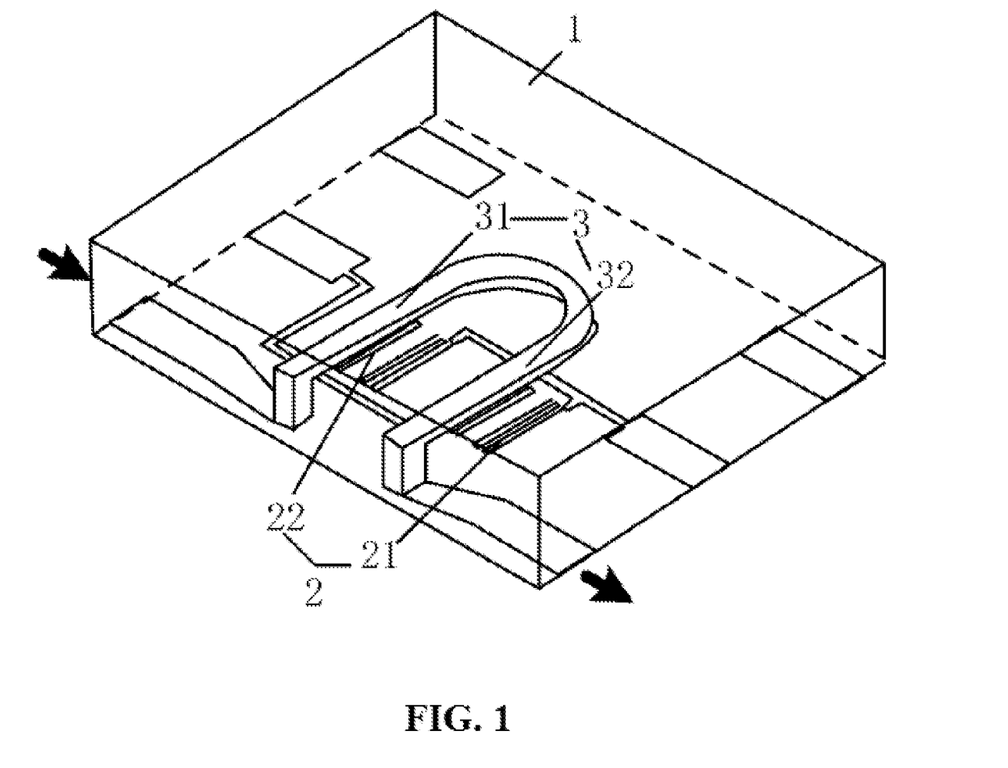
FIG. 1 is a three-dimensional structural diagram of a U-shaped primary coil integrated current sensor.
Figure 2:
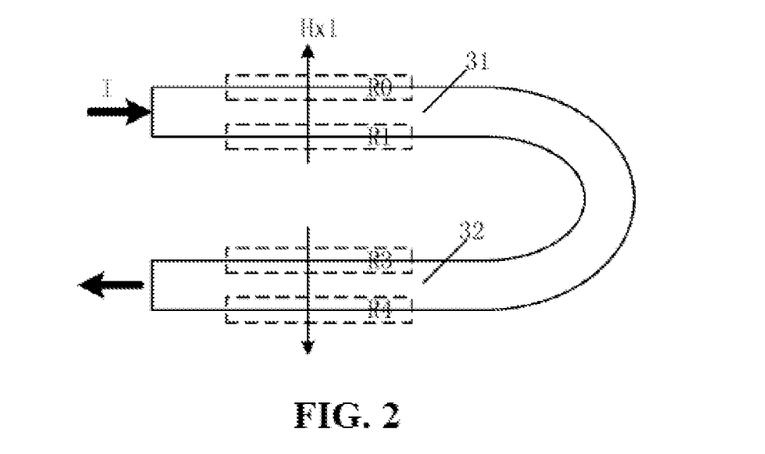
FIG. 2 is a planar structural diagram of a U-shaped primary coil integrated current sensor.
Figure 3:
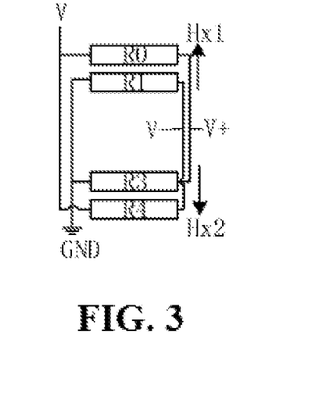
FIG. 3 is a diagram of full-bridge electrical connection of a magnetoresistive gradient sensor of a U-shaped primary coil integrated current sensor.

A current sensor is a typical application of a magnetic sensor. The principle thereof is making a detection current pass through a primary coil, generating a detection magnetic field therefrom, then sensing the intensity of the magnetic field using a magnetic sensor, and converting the detected magnetic field into a voltage signal for output, thereby establishing a relationship between the input current and the output voltage signal. An integrated current sensor integrates a magnetic sensor and a primary coil and packages them into a current sensor chip. At present, there are two types of typical integrated current sensors. FIG. 1 shows an AAV003 integrated current sensor 1 of the NVE company. A measured current thereof may be up to 5 A, and magnetic sensors 2 thereof are of a GMR type and form a full-bridge gradient sensor. A primary coil 3 is U-shaped, where the primary coil 3 includes two straight strips 31 and 32, and bridge arms 22 and 21 of two sets of magnetoresistive sensor units making up a full bridge are respectively placed below the straight strips 31 and 32. As shown in FIG. 2, bridge arms R0 and R1 correspond to the straight strip 31, bridge arms R3 and R4 correspond to the straight strip 32, a magnetic field generated by the straight strip 31 near the positions of R0 and R1 is Hx1, a magnetic field generated by the straight strip 32 near the positions of R3 and R4 is Hx2, and the two magnetic fields have opposite magnetic field directions but are of the same magnitude. The GMR magnetoresistive sensor units R0, R1, R3, and R4 have a same X magnetic field sensitive direction. A bridge connection structure is as shown in FIG. 3, which is a typical full-bridge differential structure, and two output signal ends are V+ and V− respectively.

Figure 4:
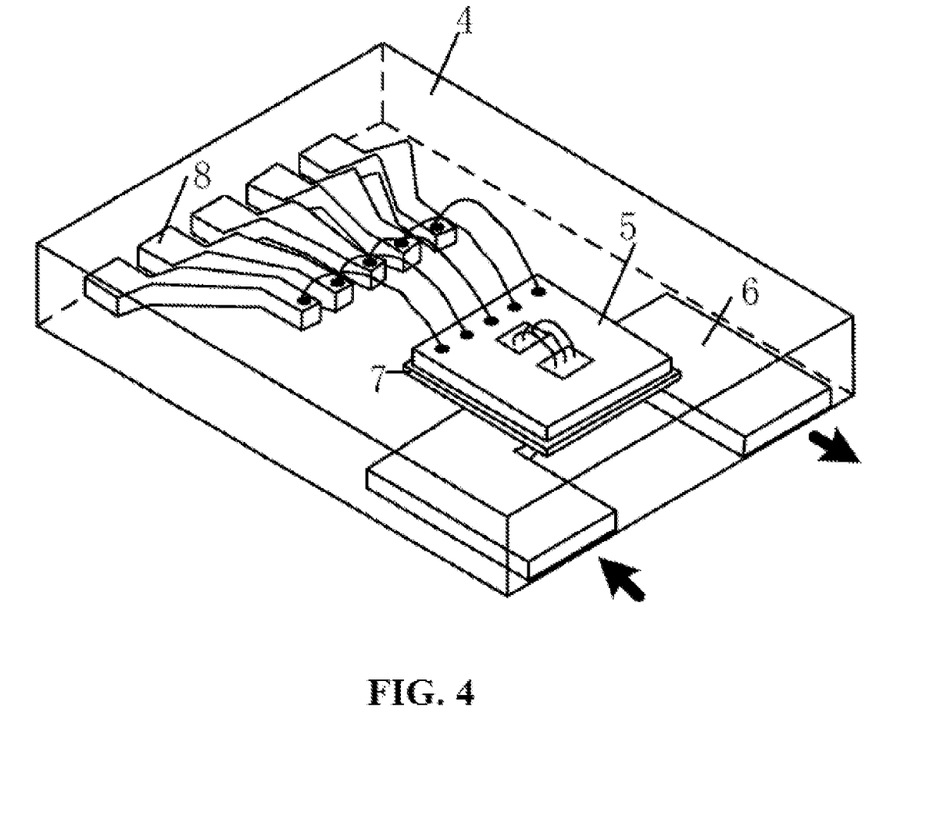
FIG. 4 is a three-dimensional structural diagram of a lead frame primary coil integrated current sensor.

FIG. 4 shows another type of integrated current sensor, i.e., a TL14970 integrated current sensor 4 of the Infineon company. A measured current thereof ranges from −50 A to +50 A. The integrated current sensor includes a Hall gradient sensor 5, a linear strip primary coil 6, a ceramic separator 7 for isolating the Hall gradient sensor 5 from the linear strip primary coil 6, and a signal output interface 8, where the stripped primary coil 6 and the signal output interface 8 are both made of a lead frame material. In addition, the Hall gradient sensor 5 is directly placed above the linear strip primary coil 6. FIG. 5 is a planar structural diagram of an integrated current sensor including a lead frame primary coil. Hall sensor units R0 and R1 are symmetrically located on two sides of a center line 9 of the primary coil 6 respectively. Z-direction magnetic field components generated by the current in the primary coil 6 at the position of R0 and the position of R1 are Hz1 and Hz2 respectively, which are of the same magnitude but in opposite directions. A differential connection structure thereof is as shown in FIG. 6, and an intermediate output signal of the half-bridge structure is Vout.

Upon comparison, it can be seen that, different from the U-shaped primary coil that requires two straight wires having opposite currents to realize a differential magnetic field, the linear strip primary coil has a larger width and is made of a lead frame material, and thus it can permit a greater current pass therethrough making it more useful for large current measurement.

As compared with Hall and GMR sensors, TMR sensors have higher magnetic field sensitivity, lower power consumption, small size, and other advantages. Therefore, by use of TMR sensors, an integrated current sensor with higher precision can be prepared. On the other hand, by use of a lead frame with a linear strip primary coil, measurement of higher-amplitude currents can be realized. In combination with the advantages of the TMR sensors and the lead frame primary coil, a new type of integrated current sensor having high precision and a larger current range can be achieved.

SUMMARY OF THE INVENTION

Therefore, an integrated current sensor combining a TMR magnetoresistive sensor having high sensitivity and low power consumption and a lead frame current is proposed herein, which is implemented in the following manner:

An integrated current sensor using a Z-axis magnetoresistive gradiometer and a lead frame current includes a Z axis gradiometer and a lead frame primary coil, where the Z axis gradiometer is a magnetoresistive Z-axis gradient sensor, including a substrate, two elongated soft magnetic flux concentrators A1 and B1 having a separate gradient feature interval Lg and placed upon the substrate, and magnetoresistive sensor strings located on the upper surface or the lower surface of the soft magnetic flux concentrators and at two side positions Y1 and Y2 equidistant from a long-axis centerline of the soft magnetic flux concentrators, such that the combined magnetoresistive sensing unit detects the magnetic field perpendicular to the long-axis center line, and it is configured as a gradiometer sensor bridge; and the lead frame primary coil includes an elongated current detection band placed directly above or below the Z axis gradiometer, the two soft magnetic flux concentrators A1 and B1 are symmetrically placed on two sides of a band center line of the elongated current detection band that is parallel to the long-axis center line of the soft magnetic flux concentrators, and the direction of a detection current in the elongated current detection band is parallel to the direction of the long-axis center line of the soft magnetic flux concentrators.

Preferably, the integrated current sensor further includes a secondary coil, where the secondary coil includes two subcoils connected in series and having opposite coiling directions, and each of the subcoils includes two straight wires symmetrically located on two sides of the long-axis center line of the soft magnetic flux concentrators and having opposite feedback current directions.

Preferably, the subcoils are located between the substrate and the Z-axis gradiometer, or located between the magnetoresistive sensing units of the Z-axis gradiometer and the soft magnetic flux concentrators.

Preferably, the magnetoresistive sensing units are GMR, TMR or AMR magnetoresistive sensing units.

Preferably, the gradient sensor bridge is a full-bridge, half-bridge or quasi-bridge structure.

Preferably, the direction of a feedback magnetic field generated at the magnetoresistive sensor strings by the feedback current in the secondary coil is opposite to the direction of a detection magnetic field generated at the magnetoresistive sensor strings by the detection current in the lead frame primary coil.

Preferably, the integrated current sensor further includes a signal processing circuit; when the integrated current sensor includes the Z axis gradiometer and the lead frame primary coil, a signal output end of the Z-axis gradiometer is connected to the signal processing circuit, and the signal processing circuit determines the value of the detection current according to a detection magnetic field gradient measured by the Z-axis gradiometer.

Preferably, the integrated current sensor further includes a signal processing circuit. When the integrated current sensor includes the Z axis gradiometer, the lead frame primary coil and the secondary coil, the signal processing circuit is a negative feedback circuit and includes a signal amplifier, a power controller and a feedback current collector, and a signal output end of the Z-axis gradiometer is connected to the signal amplifier. The detection current is input at the lead frame primary coil, generates a detection magnetic field at the Z-axis gradiometer, and after signal amplification by the signal amplifier, is input, as a feedback signal, to the power controller connected to the secondary coil. The power controller regulates the feedback current in the secondary coil, such that the detection magnetic field and the feedback magnetic field at the magnetoresistive sensing units cancel each other out, and an output signal at the Z-axis gradiometer is 0. The feedback current collector is connected to the power controller, and the value of the detection current is determined according to the value of the feedback current.

Preferably, the signal processing circuit may be an ASIC chip.

Preferably, during packaging, the lead frame primary coil and the Z-axis gradiometer are packaged together, or the lead frame primary coil, the Z-axis gradiometer, the secondary coil and the ASIC chip are packaged together.

Preferably, after packaging, the integrated current sensor may further include a soft magnetic shield that is placed above the Z-axis gradiometer.

Preferably, the amplitude of the detection current ranges from 5 A to 50 A.

Preferably, the soft magnetic flux concentrator is a soft magnetic alloy consisting of one or more elements of Co, Fe, and Ni.

Preferably, the secondary coil is made of Au, Cu, Ag or Al.

BRIEF DESCRIPTION OF THE DRAWINGS

FIGS. 9(a) and (b) are diagrams of full-bridge structure electrical connection of a Z-axis magnetoresistive gradiometer;

Figure 7:
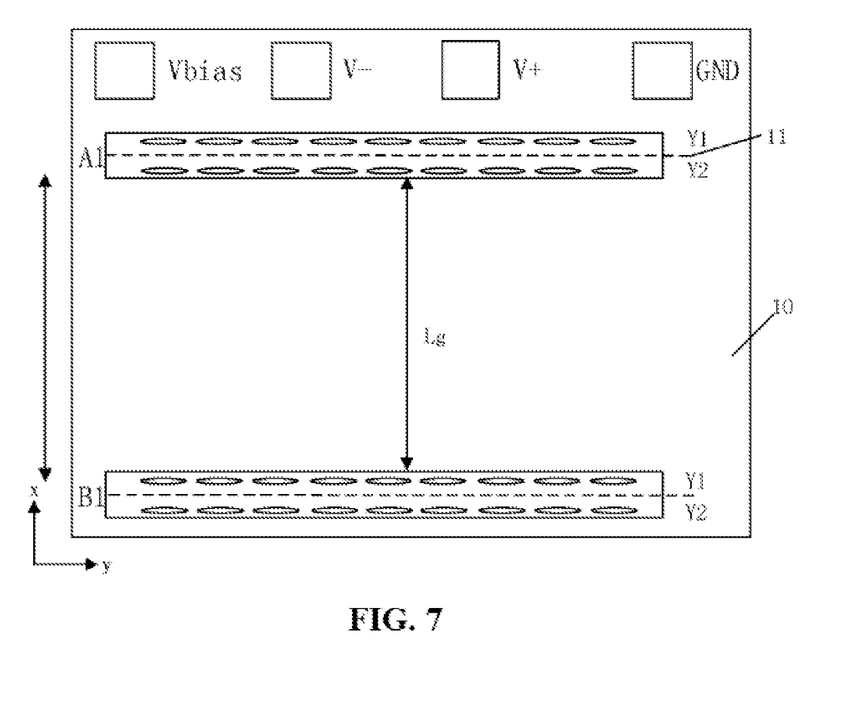
FIG. 7 is a structural diagram of a Z-axis magnetoresistive gradient sensor.
Figure 8:
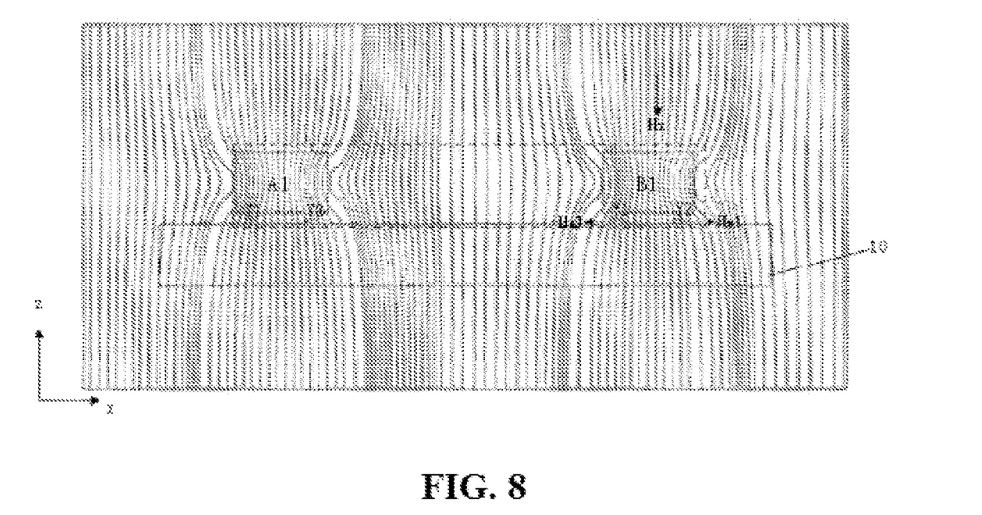
FIG. 8 is a diagram of a measurement principle of a Z-component external magnetic field.
Figure 9:
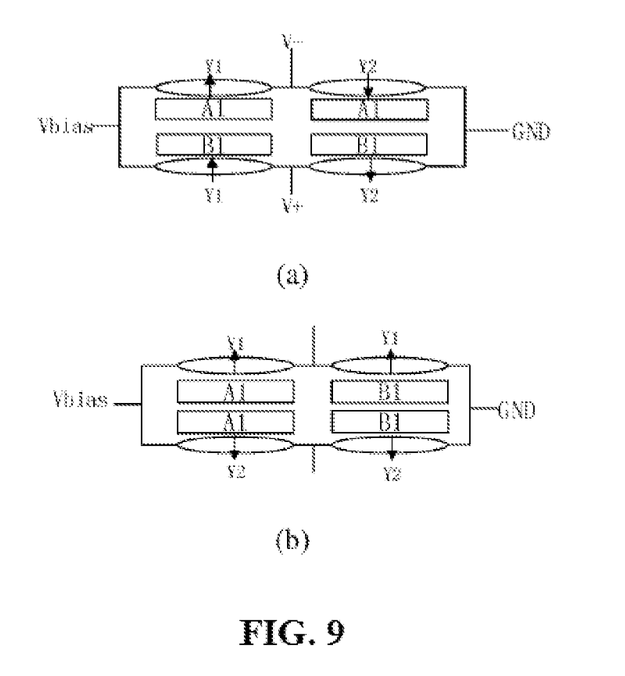

With respect to Z-axis Hall gradient sensors, in the prior patents, a magnetoresistive Z-axis gradient sensor chip (Application No. 2014102384186) has been proposed. As shown in FIG. 7, the magnetoresistive Z-axis gradient sensor chip includes a substrate 10 and two elongated soft magnetic flux concentrators A1 and B1 having a separate gradient feature interval Lg and placed upon the substrate. The elongated soft magnetic flux concentrator has a major axis in the Y direction, and a minor axis in the X direction. The magnetoresistive sensor strings are located on the upper surface or the lower surface of the soft magnetic flux concentrators A1 and B1 and at two positions Y1 and Y2 equidistant from a long-axis centerline 11 of the soft magnetic flux concentrators. The principle of measuring components of a Z-axis external magnetic field is as shown in FIG. 8. When external magnetic field components Hz from the Z axis respectively act upon the positions of the soft magnetic flux concentrators A1 and B1, the Hz components are twisted into external magnetic field components Hx1 and −Hx1 having X and −X directions and the same amplitude. As the magnetoresistive sensor strings at the positions Y1 and Y2 are all in a magnetic field sensitive X direction or −X direction, differential measurement on Z magnetic field components is implemented. The magnetoresistive sensor strings are electrically connected to form a full-bridge structure of a gradient sensor as shown in FIG. 9. In FIG. 9(a), the magnetoresistive sensor strings in A1 are connected to form a half-bridge structure and output through an intermediate signal output end V−, thereby implementing measurement on Z magnetic field components at A1. The magnetoresistive sensor strings in B1 are connected to form a half-bridge structure and also output through an intermediate signal output end V+, thereby implementing measurement on Z magnetic field components at B1. The difference between the Z magnetic field signal components at A1 and B1 is the difference between the two signal output ends V+ and V−, thereby implementing measurement on a Z magnetic field gradient. FIG. 9(b) shows a typical gradient sensor structure. The magnetoresistive sensor strings at the position Y1 or Y2 on a same side of A1 and B1 are connected to form a half-bridge structure respectively, and then difference is implemented between the two half bridges, and the output is the Z magnetic field difference component at A1 and B1.

Therefore, the present invention replaces the Hall Z-axis gradient sensor with the magnetoresistive Z-axis gradient sensor above, and implements an integrated current sensor in combination with a lead frame current. The integrated current sensor has advantages of high precision and high current amplitude.

DETAILED DESCRIPTION

The present invention is described below in detail with reference to the accompanying drawings and embodiments.

Embodiment 1

Figure 10:
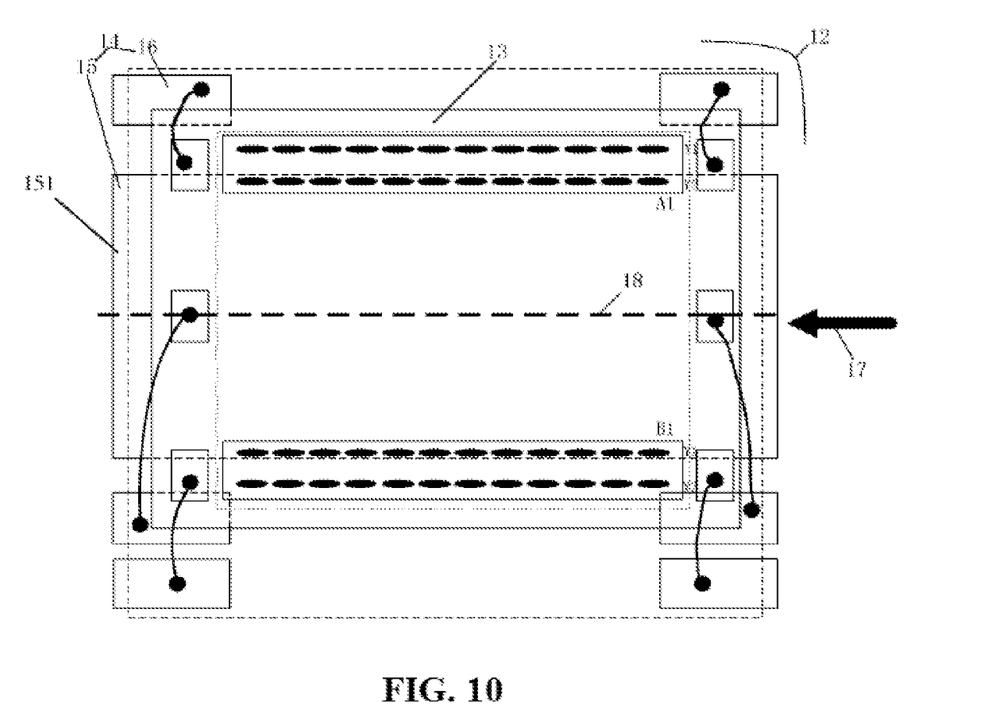
FIG. 10 is a structural diagram of a Z-axis gradiometer and a lead frame primary coil integrated current sensor.

FIG. 10 is a structural diagram of an integrated current sensor using a Z-axis gradiometer and a lead frame current, including a Z-axis gradiometer 13 and a lead frame primary coil 15. The lead frame primary coil 15 includes an elongated current detection band 151 placed directly above or below the Z-axis gradiometer 13, and may further include other current leading portions (not shown in FIG. 10). The Z-axis gradiometer 13 is a magnetoresistive Z-axis gradient sensor shown in FIG. 7. The two elongated soft magnetic flux concentrators A1 and B1 included therein are symmetrically placed on two sides of a center line 18 of the elongated current detection band 151 along a current direction 17. The pin pad 16 and the Z-axis gradiometer 13 are connected via leads. The pin pad 16 and the lead frame primary coil 15 make up a lead frame 14 together.

Figure 11:
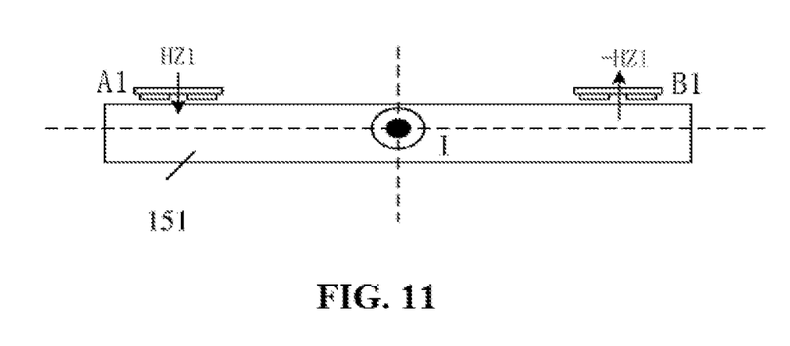
FIG. 11 is a diagram of a principle of a Z-axis gradiometer testing a current magnetic field of a lead frame primary coil.

FIG. 11 is a diagram of a principle of a Z-axis gradiometer testing a current magnetic field of the lead frame primary coil 15. Z-axis magnetic field components generated by the current in the elongated current detection band 151 at the elongated soft magnetic flux concentrators A1 and B1 are HZ1 and −HZ1 respectively, a magnetic field differential signal thereof is 2*HZ1, and a signal response Vout is generated at a signal output end of the Z-axis gradiometer. As HZ1 is in direct proportion to a current signal I, Vout is in direct proportion to the current signal I, such that the Z-axis gradiometer can measure the current I. The integrated current sensor shown in FIG. 11 can be directly applied to open-loop integrated current sensors.

Figure 12:
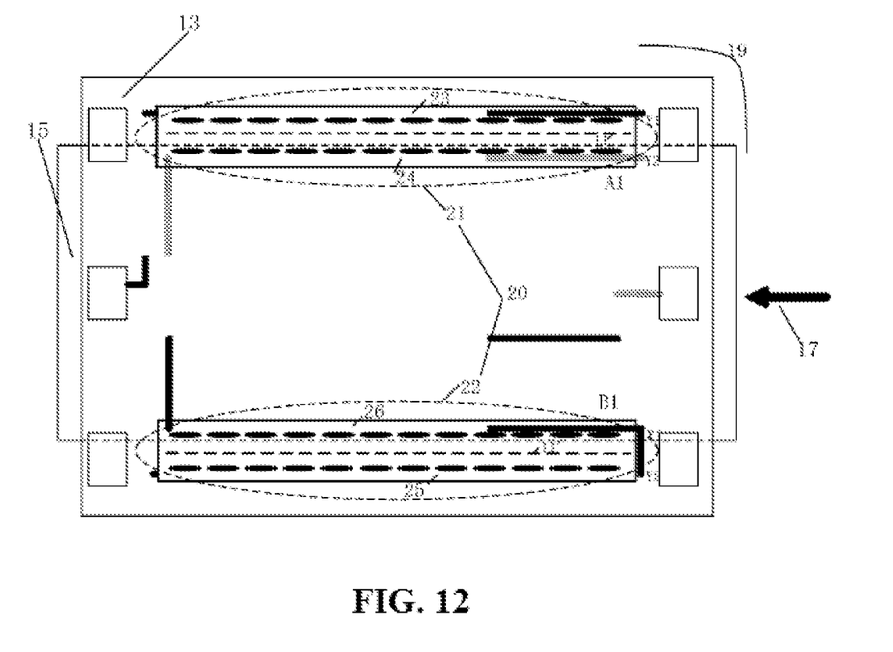
FIG. 12 is a structural diagram of a Z-axis gradiometer and a lead frame primary coil and secondary coil integrated current sensor.

FIG. 12 is a structural diagram of a Z-axis gradiometer and a lead frame primary coil and secondary coil integrated current sensor, where the integrated current sensor 19 with a secondary coil is applied to closed-loop integrated current sensors. On the basis of the integrated current sensor 12 shown in FIG. 11, a secondary coil 20 is added to the Z-axis gradiometer 13. The secondary coil 20 includes two subcoils 21 and 22, which have opposite coiling directions and are connected in series. In addition, each of the subcoils 21 and 22 includes two straight wires. The subcoil 21 includes straight wires 23 and 24, and the subcoil 22 includes straight wires 25 and 26. The straight wires are all parallel to the magnetoresistive sensor strings at Y1 and Y2, the two straight wires are symmetric relative to the long-axis center line 11 or 11' of A1 or B1, and feedback currents in the two straight wires have opposite current directions.

Figure 13:
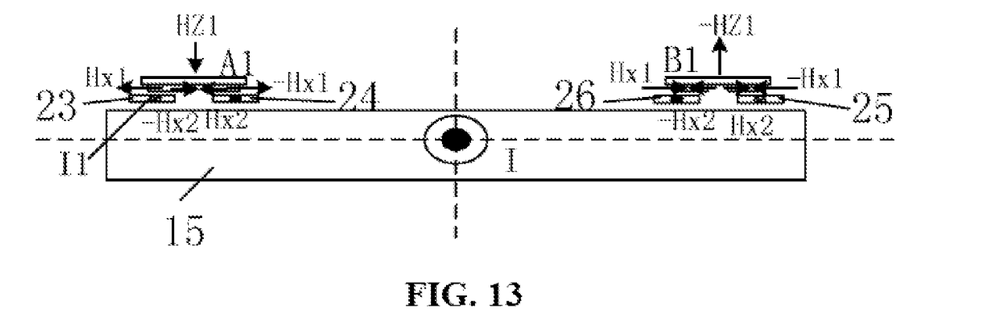
FIG. 13 is a diagram of a principle of a Z-axis gradiometer testing current magnetic fields of a lead frame primary coil and a secondary coil.

FIG. 13 is a diagram of a measurement principle of an integrated current sensor with a secondary coil. Z-axis magnetic field components generated at A1 and B1 by the lead frame primary coil 15 are HZ1 and −HZ1 respectively. After twisting by the soft magnetic flux concentrators A1 and B1, two X-direction magnetic field components, i.e., Hx1 and −Hx1, are generated respectively at the magnetoresistive sensor strings at Y1 and Y2, and the magnetic field component Hx1 is in direct proportion to the detection current I. The straight wires 23, 24, 25 and 26 of the secondary coil are as shown in FIG. 13, which are placed below the magnetoresistive sensor strings and above the substrate in the figure. Directions of the current I1 in the straight wires are as shown in FIG. 13, in which 23 and 24 have opposite current directions, 25 and 26 have opposite current directions, and two straight wires 24 and 26 on the inner side have a same current direction that is opposite to the current direction of two straight wires 23 and 25 on the outer side. X magnetic field components generated at the magnetoresistive sensor strings by the current I1 in the secondary coil are −Hx1 and Hx1 respectively, and are opposite to the direction of the current magnetic field generated by I at the same magnetoresistive sensor strings. Therefore, the total X direction magnetic field at each magnetoresistive sensor string is 0, the output signal of the Z-axis gradiometer is 0, and at this point, the detection current I in the primary coil can be determined according to the feedback current I1 in the secondary coil.

Figure 14:
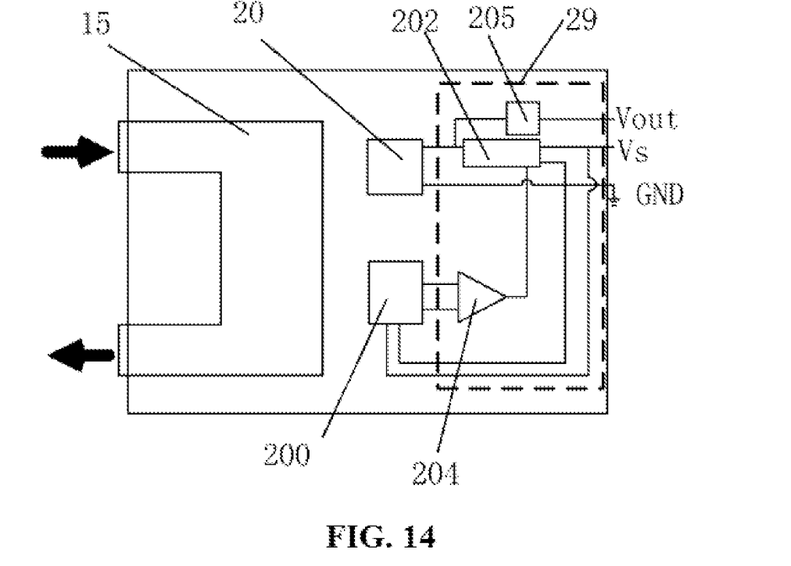
FIG. 14 is a diagram of signal processing of an integrated current sensor.

FIG. 14 is a diagram of a signal circuit including an integrated current sensor. A signal processing circuit 29 thereof includes a signal amplifier 204, a power controller 202 and a current detector 205. The detection current is input in the lead frame primary coil 15, and generates a detection magnetic field at the Z-axis gradiometer 200, and after signal amplification by the signal amplifier 204, is used as a control signal to regulate the power controller 202 on two ends of the secondary coil 20, such that the current in the secondary coil 20 generates a reverse magnetic field, until the magnetic field detected at the Z-axis gradiometer 200 is 0. At this point, the current collector 205 detects the current in the secondary coil 20, and converts the current into a signal output Vout corresponding to the primary coil current. Power supplies of the power controller 202 and the Z-axis gradiometer 200 are both provided by Vs and GND.

Figure 15:
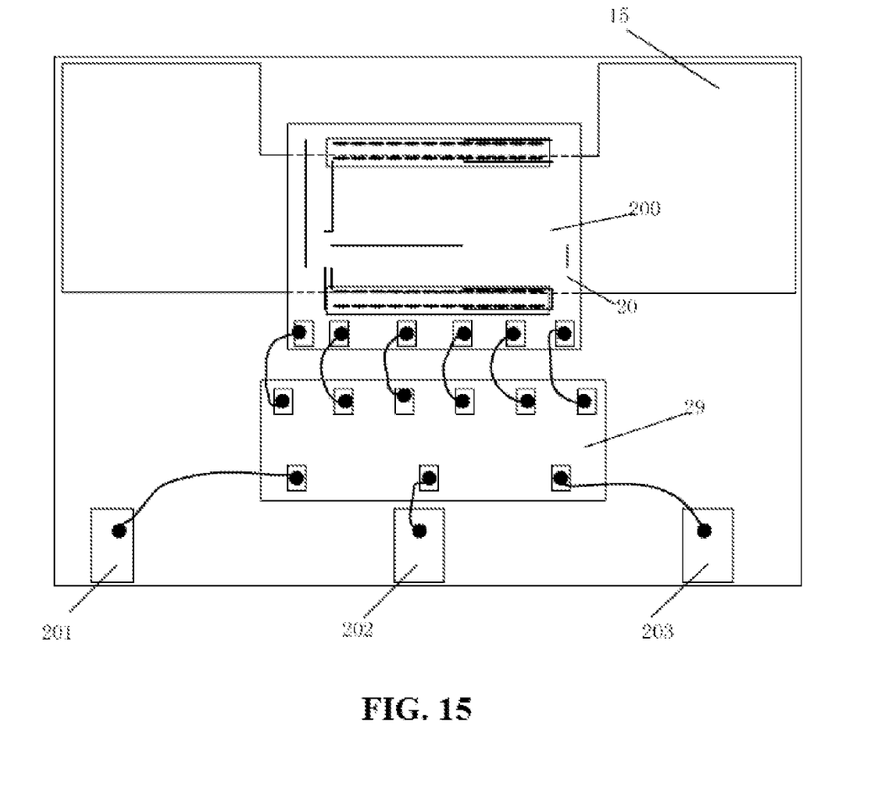
FIG. 15 shows an integrated current sensor with an ASIC signal processing circuit.

FIG. 15 is a structural diagram of an integrated current sensor including an ASIC, in which a signal output end and a power end of a Z-axis magnetoresistive sensor 200 and a current input end and a current output end of a secondary coil 20 are all connected to an ASIC unit 29. On the other hand, three external ports 201, 202 and 203 of the ASIC, i.e., three ports of an external current sensor, correspond to a power end Vs, a ground end GND and a current signal output end Vout respectively. The first two are applied to power input of the integrated current sensors, and the last is applied to signal output of the detection current.

Figure 16:
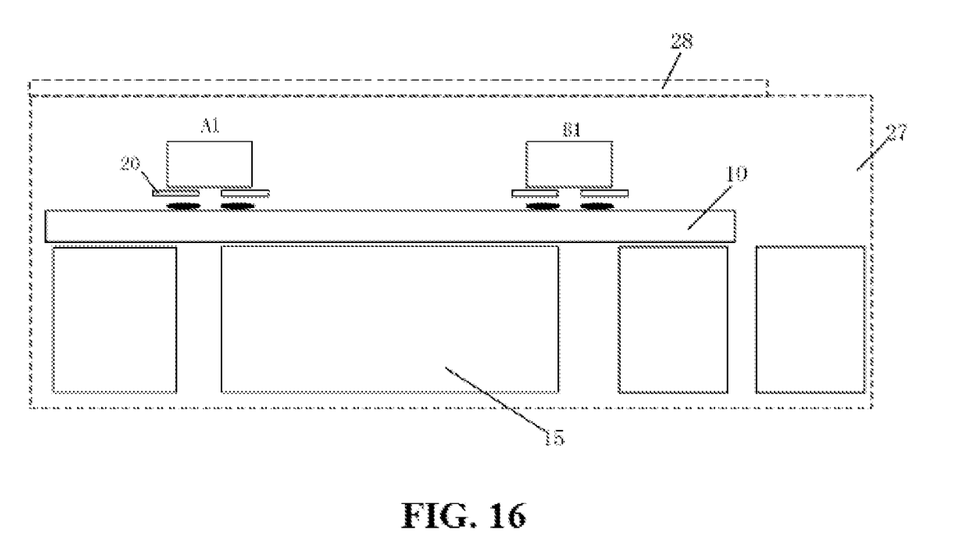
FIG. 16 is a structural diagram of package of an integrated current sensor.

FIG. 16 is a structural diagram of package of an integrated current sensor. A lead frame including a primary coil 15, a Z-axis gradient sensor placed thereabove and including a substrate 10, elongated soft magnetic flux concentrators A1 and B1, and magnetoresistive sensor strings placed thereabove or therebelow, and a secondary coil 20 are packaged together. 27 is a package material and can be used separately. In addition, the package material may also be coated with a shielding layer 28 directly above the Z-axis gradient sensor, to shield interference from an external magnetic field.

The above descriptions are merely preferred embodiments of the present invention, but are not intended to limit the present invention. For those skilled in the art, various modifications and changes can be made to the present invention. Implementations in the present invention may also be combined and changed differently. Any modification, equivalent replacement, improvement and the like made within the spirit and principle of the present invention should all fall within the protection scope of the present invention.

The invention claimed is:

1. An integrated current sensor using a Z-axis magnetoresistive gradiometer and a lead frame current, comprising a Z axis gradiometer and a lead frame primary coil,
wherein the Z axis gradiometer is a magnetoresistive Z-axis gradient sensor comprising:
a substrate,
two elongated soft magnetic flux concentrators A1 and B1 having a separate gradient feature interval Lg and placed upon the substrate, and
magnetoresistive sensor strings located on the upper surface or the lower surface of the soft magnetic flux concentrators and at two side positions equidistant from a long-axis centerline of the soft magnetic flux concentrators, such that the combined magnetoresistive sensing unit detects the magnetic field perpendicular to the long-axis center line of the soft magnetic flux concentrators, and it is configured as a gradiometer sensor bridge; and
wherein the lead frame primary coil comprises an elongated current detection band placed directly above or below the Z axis gradiometer, the two soft magnetic flux concentrators A1 and B1 are symmetrically placed on two sides of a band center line of the elongated current detection band that is parallel to the long-axis center line of the soft magnetic flux concentrators, and the direction of a detection current in the elongated current detection band is parallel to the direction of the long-axis center line of the soft magnetic flux concentrators,
wherein the integrated current sensor further comprises a secondary coil, wherein the secondary coil comprises two subcoils connected in series and having opposite coiling directions, and each of the subcoils comprises two straight wires symmetrically located on two sides of the long-axis center line of the soft magnetic flux concentrators and having opposite feedback current directions.

2. The integrated current sensor using a Z-axis magnetoresistive gradiometer and a lead frame current according to claim 1, wherein the subcoils are located between the substrate and the Z-axis gradiometer, or located between the magnetoresistive sensing units of the Z-axis gradiometer and the soft magnetic flux concentrators.

3. The integrated current sensor using a Z-axis magnetoresistive gradiometer and a lead frame current according to claim 1, wherein the magnetoresistive sensing units are GMR, TMR or AMR magnetoresistive sensing units.

4. The integrated current sensor using a Z-axis magnetoresistive gradiometer and a lead frame current according to claim 1, wherein the gradient sensor bridge is a full-bridge, half-bridge or quasi-bridge structure.

5. The integrated current sensor using a Z-axis magnetoresistive gradiometer and a lead frame current according to claim 1, wherein the direction of a feedback magnetic field generated at the magnetoresistive sensor strings by the feedback current in the secondary coil is opposite to the direction of a detection magnetic field generated at the magnetoresistive sensor strings by the detection current in the lead frame primary coil.

6. The integrated current sensor using a Z-axis magnetoresistive gradiometer and a lead frame current according to claim 1, further comprising a signal processing circuit, wherein a signal output end of the Z-axis gradiometer is connected to the signal processing circuit, and the signal processing circuit determines the value of the detection current according to a detection magnetic field gradient measured by the Z-axis gradiometer.

7. The integrated current sensor using a Z-axis magnetoresistive gradiometer and a lead frame current according to claim 1, further comprising a signal processing circuit, wherein the signal processing circuit is a negative feedback circuit and comprises a signal amplifier, a power controller and a feedback current collector, and a signal output end of the Z-axis gradiometer is connected to the signal amplifier; the detection current is input at the lead frame primary coil, generates a detection magnetic field at the Z-axis gradiometer, and after signal amplification by the signal amplifier, is input, as a feedback signal, to the power controller connected to the secondary coil; the power controller regulates the feedback current in the secondary coil, such that the detection magnetic field and the feedback magnetic field at the magnetoresistive sensing units cancel each other out, and an output signal at the Z-axis gradiometer is 0; the feedback current collector is connected to the power controller, and the value of the detection current is determined according to the value of the feedback current.

8. The integrated current sensor using a Z-axis magnetoresistive gradiometer and a lead frame current according to claim 6, wherein the signal processing circuit is an ASIC chip.

9. The integrated current sensor using a Z-axis magnetoresistive gradiometer and a lead frame current according to claim 8, wherein during packaging, the lead frame primary coil and the Z-axis gradiometer are packaged together, or the lead frame primary coil, the Z-axis gradiometer, the secondary coil and the ASIC chip are packaged together.

10. The integrated current sensor using a Z-axis magnetoresistive gradiometer and a lead frame current according to claim 9, wherein after packaging, the integrated current sensor further comprises a soft magnetic shield that is placed above the Z-axis gradiometer.

11. The integrated current sensor using a Z-axis magnetoresistive gradiometer and a lead frame current according to claim 1, wherein the amplitude of the detection current ranges from 5 A to 50 A.

12. The integrated current sensor using a Z-axis magnetoresistive gradiometer and a lead frame current according to claim 1, wherein the soft magnetic flux concentrator is a soft magnetic alloy consisting of one or more elements of Co, Fe, and Ni.

13. The integrated current sensor using a Z-axis magnetoresistive gradiometer and a lead frame current according to claim 1, wherein the secondary coil is made of Au, Cu, Ag or Al.

* * * * *

UNITED STATES PATENT AND TRADEMARK OFFICE
CERTIFICATE OF CORRECTION

PATENT NO. : 10,564,227 B2
APPLICATION NO. : 15/570104
DATED : February 18, 2020
INVENTOR(S) : Deak et al.

Page 1 of 1

It is certified that error appears in the above-identified patent and that said Letters Patent is hereby corrected as shown below:

In the Claims

In Column 7, Line 8, in Claim 1, delete "Al" and insert --A1-- therefor

In Column 7, Line 24, in Claim 1, delete "Al" and insert --A1-- therefor

Signed and Sealed this
Eleventh Day of August, 2020

Andrei Iancu
*Director of the United States Patent and Trademark Office*